United States Patent
Nakano et al.

(10) Patent No.: US 10,403,802 B2
(45) Date of Patent: Sep. 3, 2019

(54) METHOD FOR MANUFACTURING LED DISPLAY PANEL

(71) Applicant: MITSUBISHI ELECTRIC CORPORATION, Tokyo (JP)

(72) Inventors: Yuzo Nakano, Tokyo (JP); Shigenori Shibue, Tokyo (JP); Naoki Haze, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/781,056

(22) PCT Filed: Sep. 23, 2016

(86) PCT No.: PCT/JP2016/077936
§ 371 (c)(1),
(2) Date: Jun. 1, 2018

(87) PCT Pub. No.: WO2017/126160
PCT Pub. Date: Jul. 27, 2017

(65) Prior Publication Data
US 2018/0366625 A1    Dec. 20, 2018

(30) Foreign Application Priority Data

Jan. 19, 2016   (JP) .................................. 2016-007643

(51) Int. Cl.
*H01L 33/58* (2010.01)
*H01L 27/15* (2006.01)
(Continued)

(52) U.S. Cl.
CPC .............. *H01L 33/58* (2013.01); *G09F 9/00* (2013.01); *G09F 9/33* (2013.01); *H01L 25/0753* (2013.01);
(Continued)

(58) Field of Classification Search
CPC ......... H01L 27/15–156; H01L 27/3211; H01L 27/3213; H01L 27/3218; H01L 25/075;
(Continued)

(56) References Cited

U.S. PATENT DOCUMENTS

2005/0230698 A1   10/2005  Sakai
2006/0105485 A1    5/2006  Basin et al.
(Continued)

FOREIGN PATENT DOCUMENTS

CN    101386194 A    3/2009
JP     5-52882 U     7/1993
(Continued)

OTHER PUBLICATIONS

International Search Report for PCT/JP2016/077936 (PCT/ISA/210) dated Dec. 6, 2016.
(Continued)

*Primary Examiner* — Zandra V Smith
*Assistant Examiner* — Molly K Reida
(74) *Attorney, Agent, or Firm* — Birch, Stewart, Kolasch & Birch, LLP (57) ABSTRACT

It is an object of the present invention to provide an LED panel and an LED display that enhance orientation properties of LEDs and the efficiency of light use with a simple configuration. It is a different object of the present invention to provide a method for manufacturing the LED display panel, the method reducing an increase in process step. An LED display panel according to an aspect of the present invention includes the following: a plurality of chip-on-board LEDs mounted on a substrate, the LEDs each having a light-emitting surface on a surface opposite a substrate side; and a plurality of light-transmissive members. Each light-transmissive member is disposed on the substrate to cover the light-emitting surface of at least one of the LEDs. Each light-transmissive member is configured to enhance the directionality of outgoing light emitted from the LEDs.

4 Claims, 11 Drawing Sheets

(51) Int. Cl.
  *H01L 33/48* (2010.01)
  *G06F 9/00* (2006.01)
  *G09F 9/33* (2006.01)
  *H01L 25/075* (2006.01)
  *H01L 33/54* (2010.01)
  *G09F 9/00* (2006.01)

(52) U.S. Cl.
  CPC .............. *H01L 27/15* (2013.01); *H01L 33/48* (2013.01); *H01L 33/54* (2013.01); *H01L 2933/005* (2013.01); *H01L 2933/0033* (2013.01); *H01L 2933/0058* (2013.01)

(58) Field of Classification Search
  CPC ..... H01L 25/0753; H01L 33/52; H01L 33/54; H01L 2933/0033; H01L 2933/005; H01L 2933/0058; G09F 9/33
  See application file for complete search history.

(56) References Cited

U.S. PATENT DOCUMENTS

| | | |
|---|---|---|
| 2006/0235107 A1 | 10/2006 | Takamatsu et al. |
| 2009/0004778 A1 | 1/2009 | Lee et al. |
| 2009/0008673 A1 | 1/2009 | Kato et al. |
| 2011/0122172 A1 | 5/2011 | Tanigawa et al. |
| 2012/0175812 A1 | 7/2012 | Ikeda et al. |
| 2017/0140679 A1 | 5/2017 | Tomoda et al. |

FOREIGN PATENT DOCUMENTS

| | | |
|---|---|---|
| JP | 8-287719 A | 11/1996 |
| JP | 2004-79750 A | 3/2004 |
| JP | 2005-251875 A | 9/2005 |
| JP | 2006-295054 A | 10/2006 |
| JP | 2007-73752 A | 3/2007 |
| JP | 2007-112973 A | 5/2007 |
| JP | 2009-506530 A | 2/2009 |
| JP | 2011-112737 A | 6/2011 |
| JP | 2012-146770 A | 8/2012 |
| JP | 2013-38369 A | 2/2013 |
| JP | 2014-99468 A | 5/2014 |
| JP | 2015-194515 A | 11/2015 |

OTHER PUBLICATIONS

Extended European Search Report issused in corresponding EP Application 16886400.7 dated Dec. 5, 2018.
International Preliminary Report on Patentability issued in corresponding International Application No. PCT/JP2016/077936, with English translation.

METHOD FOR MANUFACTURING LED DISPLAY PANEL

TECHNICAL FIELD

The present invention relates to a method for manufacturing an LED display panel.

BACKGROUND ART

Known LED displays include a plurality of light emitting diodes (LEDs) arranged in a square-array manner, and display video information by controlling blinks of the individual LEDs.

A technical development and a cost reduction of the LEDs achieve various uses of the LED displays, including a use for indoor-and-outdoor advertisement display. These LED displays have mainly displayed dynamic images, such as nature images and animated images. With respect to indoor use, a shortened pitch of pixels has achieved a shorter distance of vision. Consequently, the LED displays have been used to display images of personal computers used in conference rooms or used for monitor. With respect to the monitor use in particular, the LED displays have increasingly displayed nearly static images of the personal computers.

The mainstream of such an LED display is a surface-mount-device (SMD) LED display that includes a small LED package mounted on a substrate, the LED package including the LEDs placed within a ceramic or resin cavity, and fixed from thereabove with a resin sealant. The SMD LED display has been mainly used as a large display with a pixel pitch of 3 mm or more.

The LEDs have been manufactured at lower cost and have been received a demand for a higher precision of the manufacture. In view of this, products having a small pixel pitch of, for instance, about 1.9 mm or 1.5 mm are on the market. Further, in order for the LEDs to be more precise, a chip-on-board (COB) LED display is used that includes LEDs with no shell directly mounted on the substrate instead of the SMD LED packages, which individually include the LEDs processed into the cavities. Consequently, such a COB LED display can include the LEDs in higher density.

For instance, an LED display disclosed in Patent Document 1 or 2 includes LEDs and columnar or convex lenses disposed on the individual LEDs. Such an LED display improves an orientation property, thereby increasing the efficiency of light use. Further, a different LED display disclosed in Patent Document 3 includes the following: a plurality of LEDs arranged on a substrate; a reflection plate having a plurality of holes corresponding one-to-one to the LEDs, the reflection plate being secured to the substrate while being aligned with the substrate; and a light-reflection case including a glass plate and disposed on the reflection plate. Consequently, such an LED display improves an orientation property and reduces the nonuniformity in luminance.

PRIOR ART DOCUMENTS

Patent Documents

Patent Document 1: Japanese Patent Application Laid-Open No. 2011-112737
Patent Document 2: Japanese Utility Model Application Laid-Open No. 5-52882
Patent Document 3: Japanese Patent Application Laid-Open No. 2004-79750

SUMMARY

Problem to be Solved by the Invention

Reference is made to the light-distribution control of the conventional LED display. The conventional LED display includes components, such as the lenses over the individual LEDs, the resin for fixing the lenses, and the light-reflection case. This makes the structure of the LED display complex. Consequently, the number of process steps for manufacturing the LED display increase. This results in increases in time and cost for the manufacture. Further, the conventional LED display is used to form a large-screen display that includes a plurality of LED display panels jointed together. In this case, steps of luminance cause noticeable joints of an LED display panel when viewed from an oblique direction of the LED display panel.

The present invention has been made to solve these problems. It is an object of the present invention to provide an LED panel and an LED display that enhance orientation properties of LEDs and the efficiency of light use with a simple configuration. It is a different object of the present invention to provide a method for manufacturing the LED display panel, the method reducing an increase in process step.

Means to Solve the Problem

An LED display panel according to an aspect of the present invention includes the following: a plurality of chip-on-board LEDs arranged and mounted on a substrate, the LEDs each having a light-emitting surface on a surface opposite a substrate side; and a plurality of light-transmissive members. Each light-transmissive member is disposed on the substrate to cover the light-emitting surface of at least one of the LEDs. Each light-transmissive member is configured to enhance a directionality of outgoing light emitted from the LEDs.

Effects of the Invention

The LED display panel according to the aspect of the present invention is configured such that the plurality of LEDs emitting light beams having different colors from each other constitute a single pixel unit, and that the light-transmissive member is provided to cover the light-emitting surface for each pixel unit. Such a configuration enables orientation properties of the LEDs located in the outer periphery of the LED display panel to be close to an orientation property of the LED located inside the LED display panel. This improves and harmonizes light-distribution properties of the LEDs, and particularly, the orientation properties of the LEDs located in the outer periphery of the LED display panel, and enhances the efficiency of light use.

These and other objects, features, aspects and advantages of the present invention will become more apparent from the following detailed description of the present invention when taken in conjunction with the accompanying drawings.

DESCRIPTION OF EMBODIMENT(S)

<Fundamental Technique>

Figure 17:
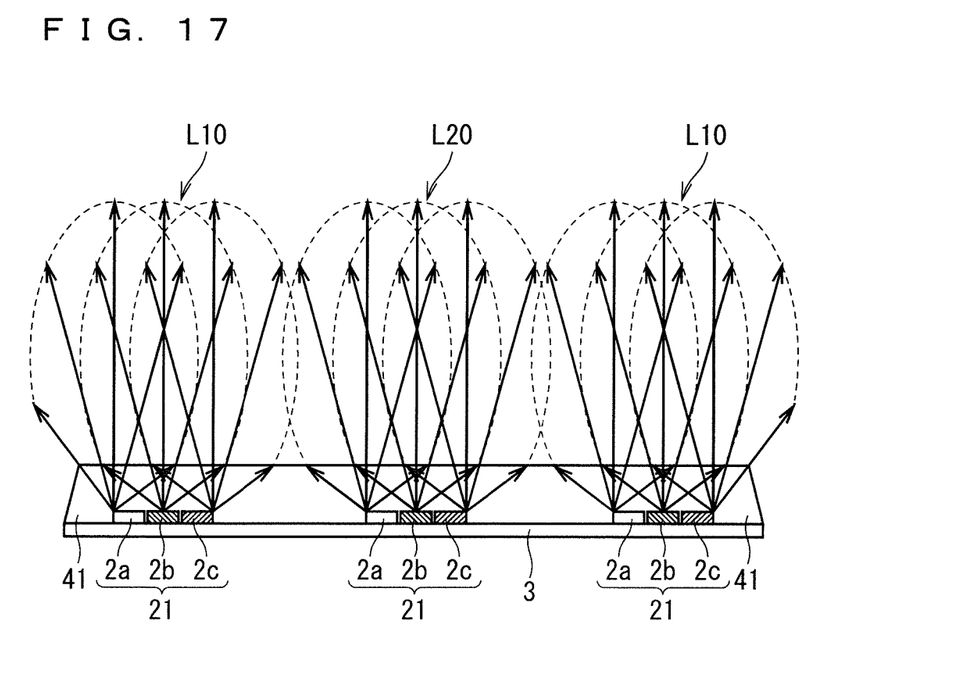
FIG. 17 is a diagram of a light-distribution property of an LED display panel according to a fundamental technique.
Figure 18:
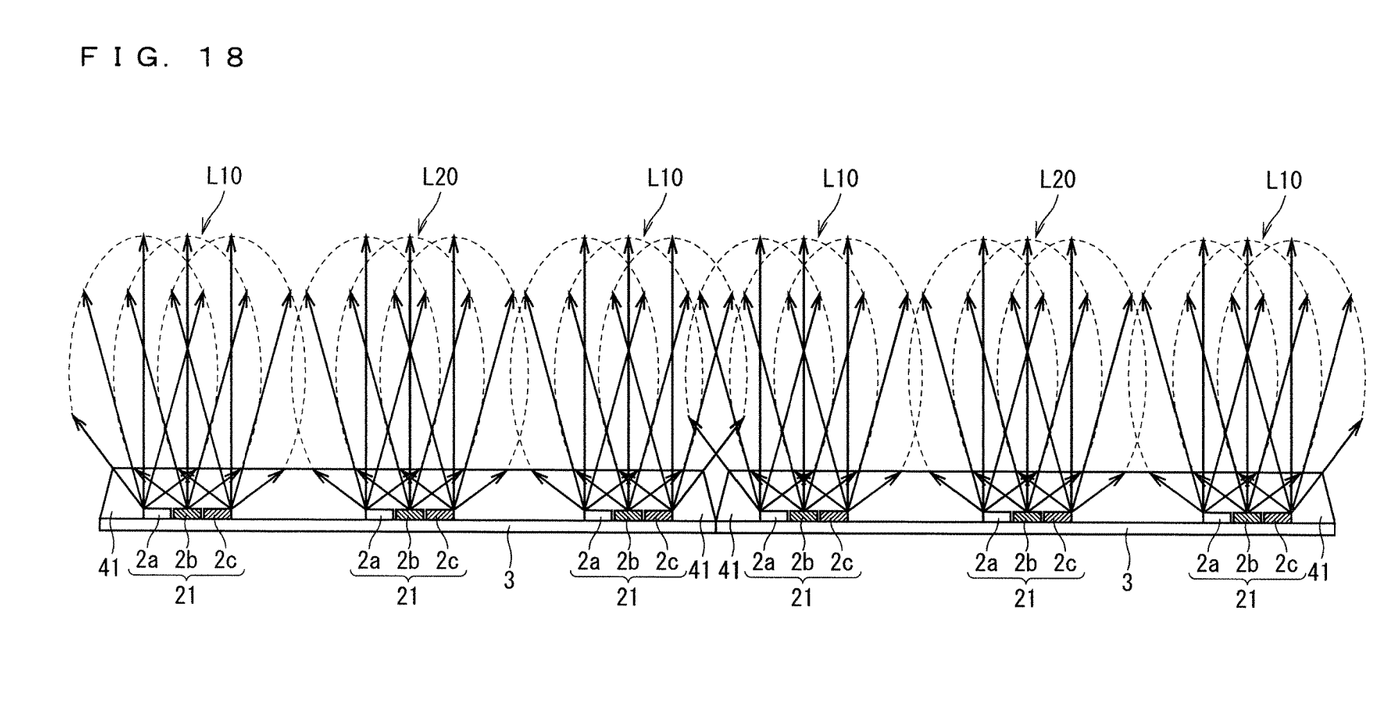
FIG. 18 is a diagram of a light-distribution property at a joint between the LED display panels according to the fundamental technique.

Prior to the description of the embodiments of the present invention, the following describes a technique that is fundamental to the present invention. FIG. 17 is a diagram of a light-distribution property of an LED display panel according to a fundamental technique, the LED display panel including a plurality of COB LEDs each covered with a light-transmissive member such as a resist resin material. FIG. 18 is a diagram of a light-distribution property at a joint between the LED displays according to the fundamental technique, the LED displays each including a plurality of LED display panels including the COB LEDs.

As illustrated in FIG. 17, the COB LED display panel in the fundamental technique includes a plurality of LEDs 2a, 2b, and 2c arranged and mounted on a substrate 3. The LEDs 2a, 2b, and 2c are arranged per pixel unit 21. Each pixel unit 21 includes the LED 2a that is red, the LED 2b that is green, and the LED 2c that is blue. The LEDs 2a, 2b, and 2c each have a light-emitting surface on a surface opposite the substrate 3.

As illustrated in FIG. 17, the COB LED display panel includes a light-transmissive member 41 disposed on the substrate 3 to cover the light-emitting surfaces of the pixel units 21. The light-transmissive member 41 transmits light. Examples of the light-transmissive member 41 include an epoxy resin and an acrylic resin.

FIG. 17 illustrates divergences of outgoing light emitted from each pixel unit 21 in the COB LED display panel according to the fundamental technique. A comparison is made between outgoing light L10 emitted from the pixel units 21 located in the outermost periphery of the substrate 3 (i.e., the left and right ends in FIG. 17), and outgoing light L20 emitted from the pixel unit 21 located inside the substrate 3. The comparison reveals that the outgoing light L10 has a non-uniform orientation of light under the influence of the ends of the light-transmissive member 41. In other words, in the COB LED display panel according to the fundamental technique, orientation properties of the pixel units 21 located in the outermost periphery of the substrate 3 are different from an orientation property of the pixel unit 21 located inside the substrate 3.

As illustrated in FIG. 18, provided is a large screen that includes a plurality of the COB LED display panels according to the fundamental technique. In this case, the pixel units 21 having non-uniform orientation properties (i.e., the pixel units emitting the outgoing light L10) are arranged at a boundary between the display panels adjacent to each other. Unfortunately, such an arrangement is likely to produce a visible step of luminance at the boundary between the LED display panels, thereby degrading the continuity of the screen. The embodiments of the present invention solve this problem.

First Embodiment

<Configuration>

Figure 1:
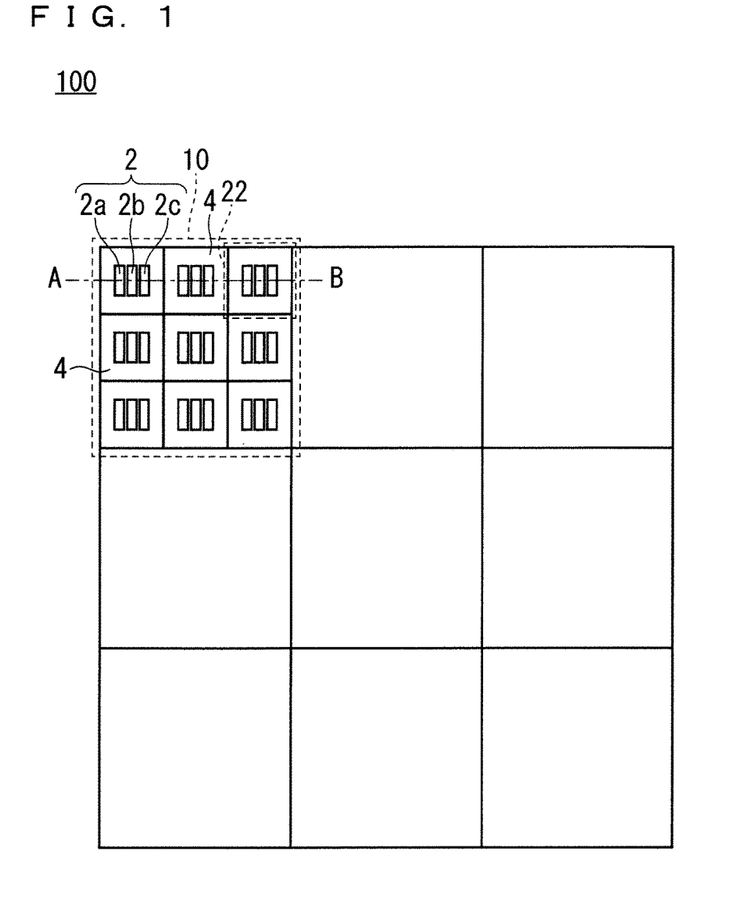
FIG. 1 is a plan view of an LED display according to a first embodiment.
Figure 2:
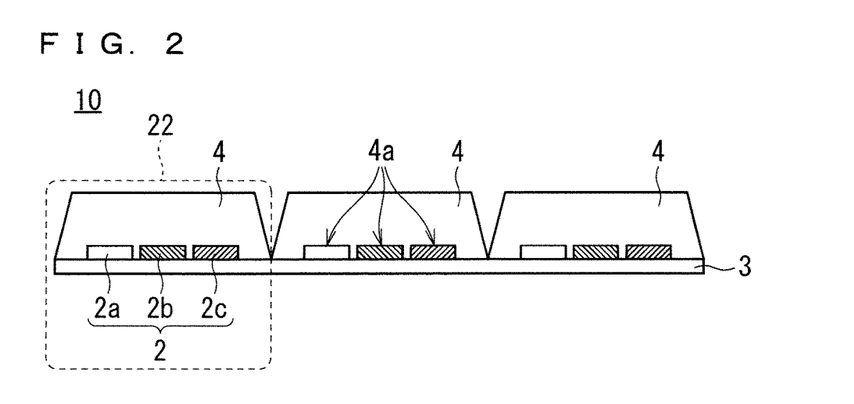
FIG. 2 is a cross-sectional view of an LED display panel according to the first embodiment.

FIG. 1 is a plan view of an LED display 100 according to a first embodiment. The LED display 100 includes a plurality of chip-on-board (COB) LED display panels 10 arranged in matrix. The LED display panels 10 each include a plurality of COB LED packages 22 arranged in matrix. FIG. 2 is a cross-sectional view of the COB LED display panel 10, taken along line AB in FIG. 1. The COB LED packages 22, which constitute the COB LED display panel 10, includes a plurality of COB LEDs 2a, 2b, and 2c, and a plurality of light-transmissive members 4.

As illustrated in FIGS. 1 and 2, the COB LED display panel 10 is configured such that the LEDs 2a, 2b, and 2c are arranged and mounted on a substrate 3. The substrate 3 is a ceramic substrate. The LEDs 2a, 2b, and 2c are arranged per pixel unit 2. Each pixel unit 2 includes the LED 2a that is red, the LED 2b that is green, and the LED 2c that is blue. The COB LED packages 22, each of which includes the pixel unit 2 and the light-transmissive member 4, are arranged on the substrate 3 in matrix, as illustrated in, for instance, FIG. 1. The COB LED display panels 10 is configured such that each pixel unit 2 has any size including a size of 3×3, a size of 16×16, a size of 120×90, a size of 160×120, and a size of 160×180.

In the first embodiment, the LEDs 2a, 2b, and 2c each have a light-emitting surface on a surface opposite the substrate 3.

As illustrated in FIG. 2, the light-transmissive members 4 are each disposed on the substrate 3 to cover the light-emitting surfaces of a group of the LEDs 2a, 2b, and 2c. Each light-transmissive member 4 has a shape of a frustum of a quadrangle whose lower base side is the substrate-3-side. The light-emitting surfaces on the upper base side of the light-transmissive member 4 having a frustum of a quadrangle, each are set to have a sufficient size such that an angle of light emitted from the LEDs 2a and 2c is equal to an angle of light emitted from the LED 2b so that the light distribution of the LEDs 2a and 2c in the outermost periphery is uniform. The light-transmissive member 4 is an ultraviolet-curing resin that transmits light and conducts heat. Examples of the ultraviolet-curing resin include an epoxy resin and an acrylic resin. The light-transmissive member 4 has preferably good thermal conductivity in view of the heat dissipation properties of the LEDs 2a, 2b, and 2c.

The lower base of the light-transmissive member 4 has recesses 4a. Each of the LEDs 2a, 2b and 2c is accommodated between the recess 4a and the substrate 3 without any gaps.

<Manufacturing Method>

Figure 3:
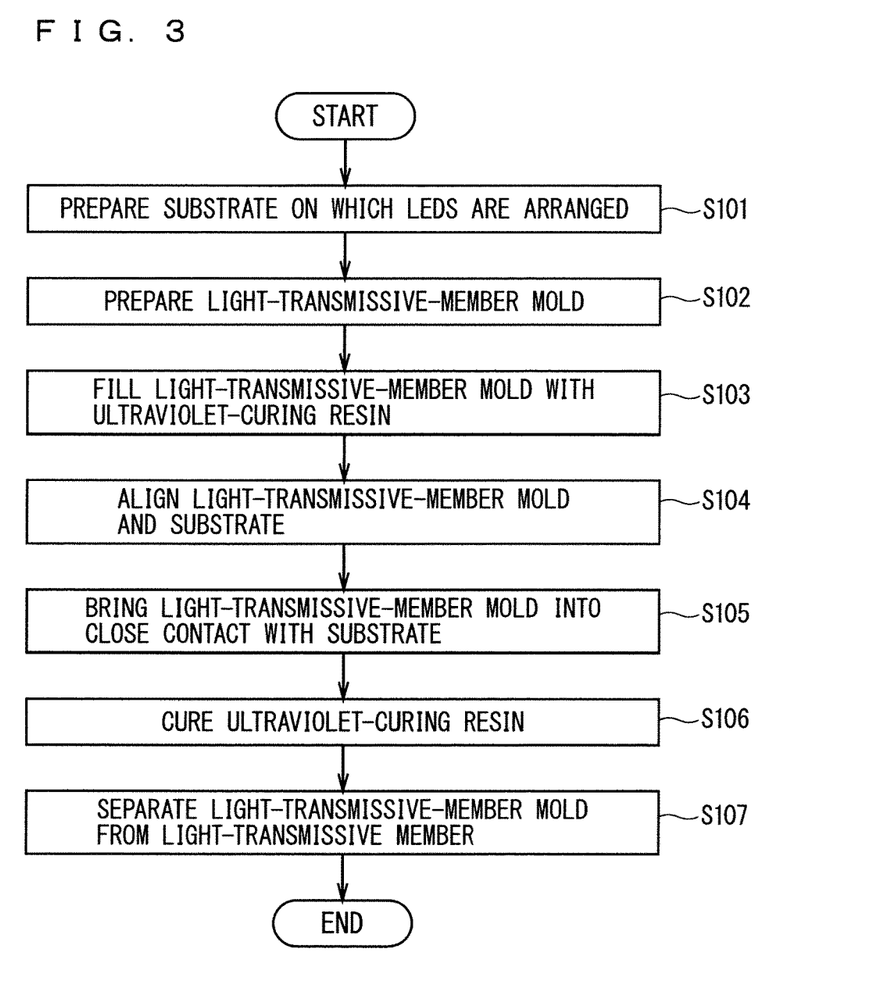
FIG. 3 is a flowchart of process steps for manufacturing the LED display panel according to the first embodiment.
Figure 4:
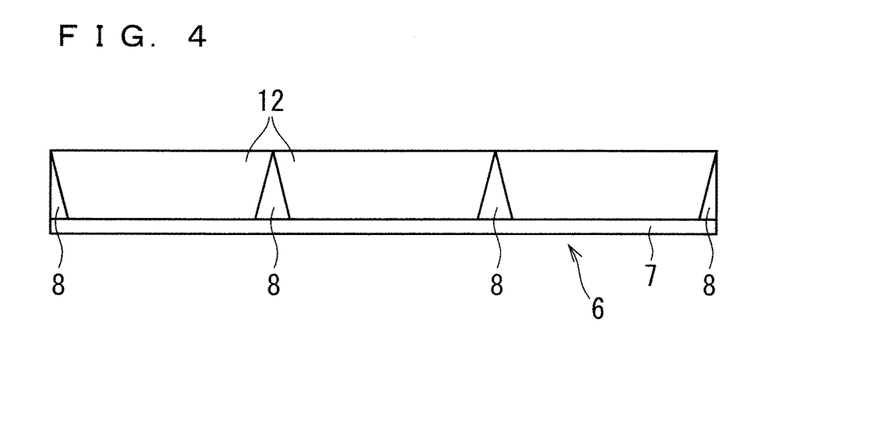
FIG. 4 is a cross-sectional view of a light-transmissive-member mold used in the manufacture of the LED display panel according to the first embodiment.

FIG. 3 is a flowchart of process steps for manufacturing the COB LED display panels 10, which constitute the LED display panel 100. The first step (step S101) is preparing the substrate 3 on which the LEDs 2a, 2b, and 2c are mounted. The second step (step S102) is preparing the light-transmissive-member mold 6. FIG. 4 is a cross-sectional view of the light-transmissive-member mold 6. As illustrated in FIG. 4, the light-transmissive-member mold 6 includes a light-transmissive substrate 7 and partitions 8. The partitions 8 each define the outline of the light-transmissive member 4. The partition 8 is held by the light-transmissive substrate 7 in such a manner that the lower base of the light-transmissive member 4 (i.e., the substrate-3-side) is open.

The third step (step S103) is, as illustrated in FIG. 4, filling the light-transmissive-member mold 6 with an ultraviolet-curing resin 12. That is, the liquid ultraviolet-curing resin 12 is filled between the partitions 8.

Figure 5:
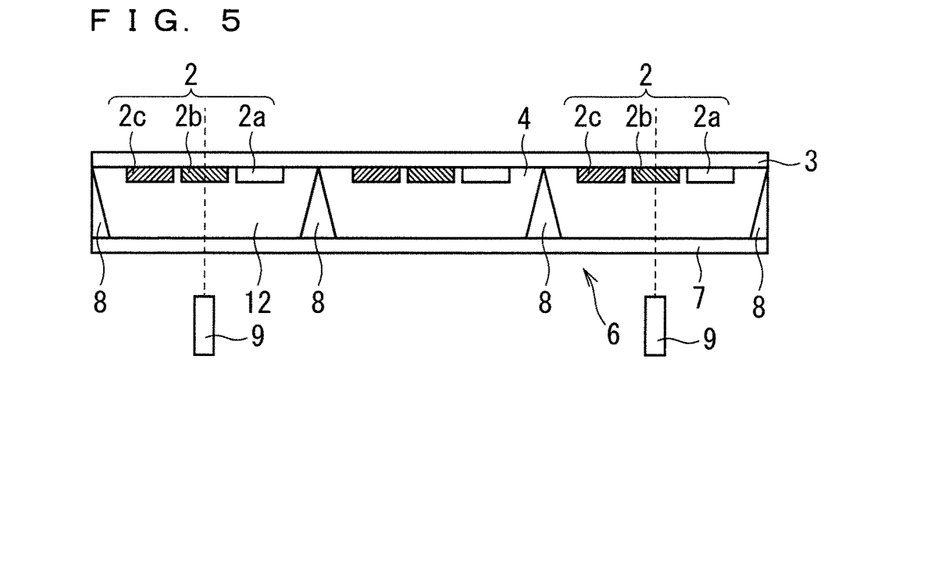
FIG. 5 is a diagram illustrating a step of forming a light-transmissive member in the manufacture of the LED display panel according to the first embodiment.

The fourth step (step S104) is aligning the light-transmissive-member mold 6 and the substrate 3. This alignment is performed by the use of position detecting sensors 9. FIG. 5 is a cross-sectional view that is used for describing the alignment of the light-transmissive-member mold 6 and the substrate 3. The position detecting sensors 9 are disposed in, for instance, positions corresponding to the respective four corners of the light-transmissive-member mold 6. The position detecting sensor 9 on the right side of FIG. 5 detects the LED 2b, which is included in the pixel unit 2 mounted on the substrate 3, through the light-transmissive substrate 7 and the ultraviolet-curing resin 12. Further, the position detecting sensor 9 on the left side of FIG. 5 detects the LED 2b, which is included in the pixel unit 2 mounted on the substrate 3, through the light-transmissive substrate 7 of the light-transmissive-member mold 6 and the ultraviolet-curing resin 12. The position detecting sensor 9 each include a camera for instance. This camera recognizes the LED 2b. The position detecting sensor 9 recognizes the size of the outer shape of the LED 2b and the position of the LED 2b to detect the exact center position of the LED 2b. A transfer mechanism (not shown) transfers the substrate 3 in accordance with a detection result in the position detecting sensor 9, and adjusts a relative position of the partition 8 and the LED 2b with high accuracy.

After the alignment of the light-transmissive-member mold 6 and the substrate 3, the fifth step (step S105) is bringing the light-transmissive-member mold 6 into close contact with the substrate 3.

The sixth step (step S106) is irradiating the ultraviolet-curing resin 12 with ultraviolet lays through the light-transmissive substrate 7 of the light-transmissive-member mold 6 to cure the ultraviolet-curing resin 12. The ultraviolet-curing resin 12 as cured is now turned into the light-transmissive members 4.

Figure 6:
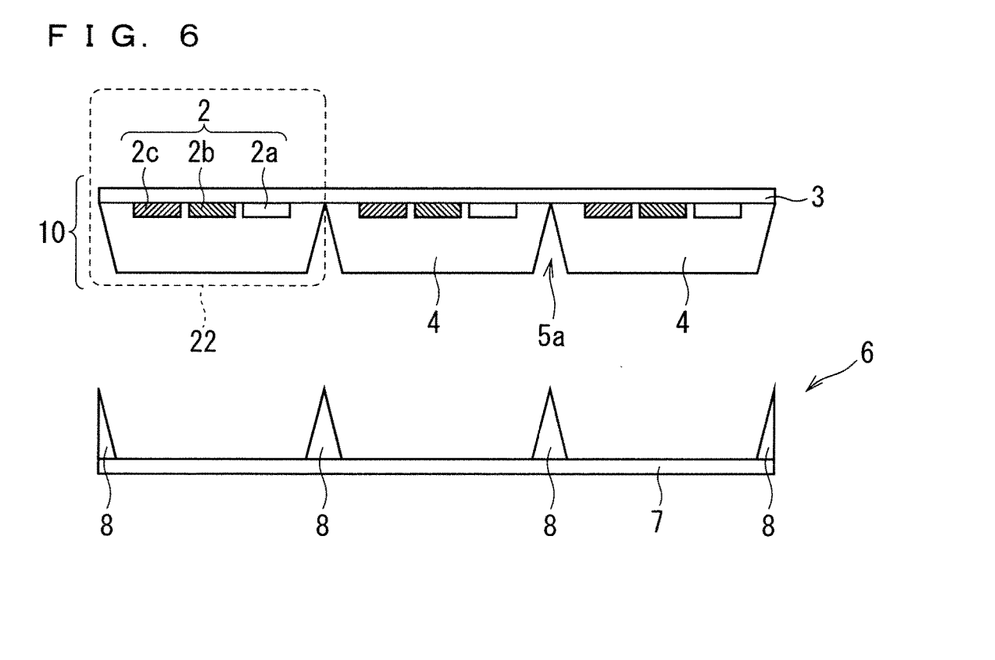
FIG. 6 is a diagram illustrating a step of forming the light-transmissive member in the manufacture of the LED display panel according to the first embodiment.

After the cure of the ultraviolet-curing resin 12, i.e., the formation of the light-transmissive members 4, the seventh step (step S107) is separating the light-transmissive-member mold 6 from the light-transmissive members 4 while bending the light-transmissive substrate 7. FIG. 6 is a cross-sectional view of the light-transmissive-member mold 6 that has been separated from the light-transmissive members 4. Through these process steps, the LED display panel 10, according to the first embodiment, including the COB LED packages 22 that are arranged is completed. Then, the LED display 100 is obtained by arranging the plurality of LED display panels 10 to form a single large screen.

Figure 7:
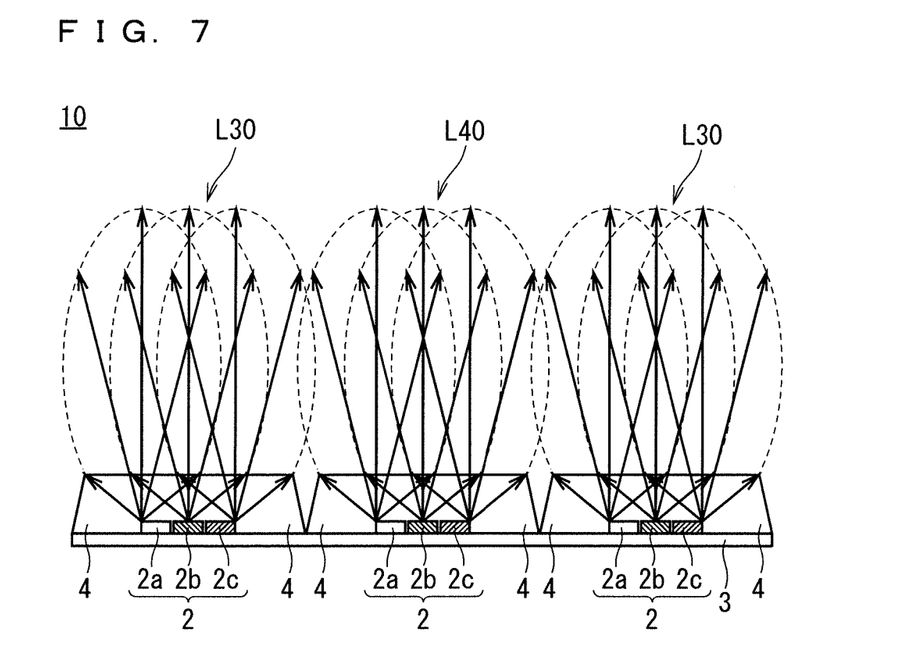
FIG. 7 is a diagram of a light-distribution property of the LED display panel according to the first embodiment.
Figure 8:
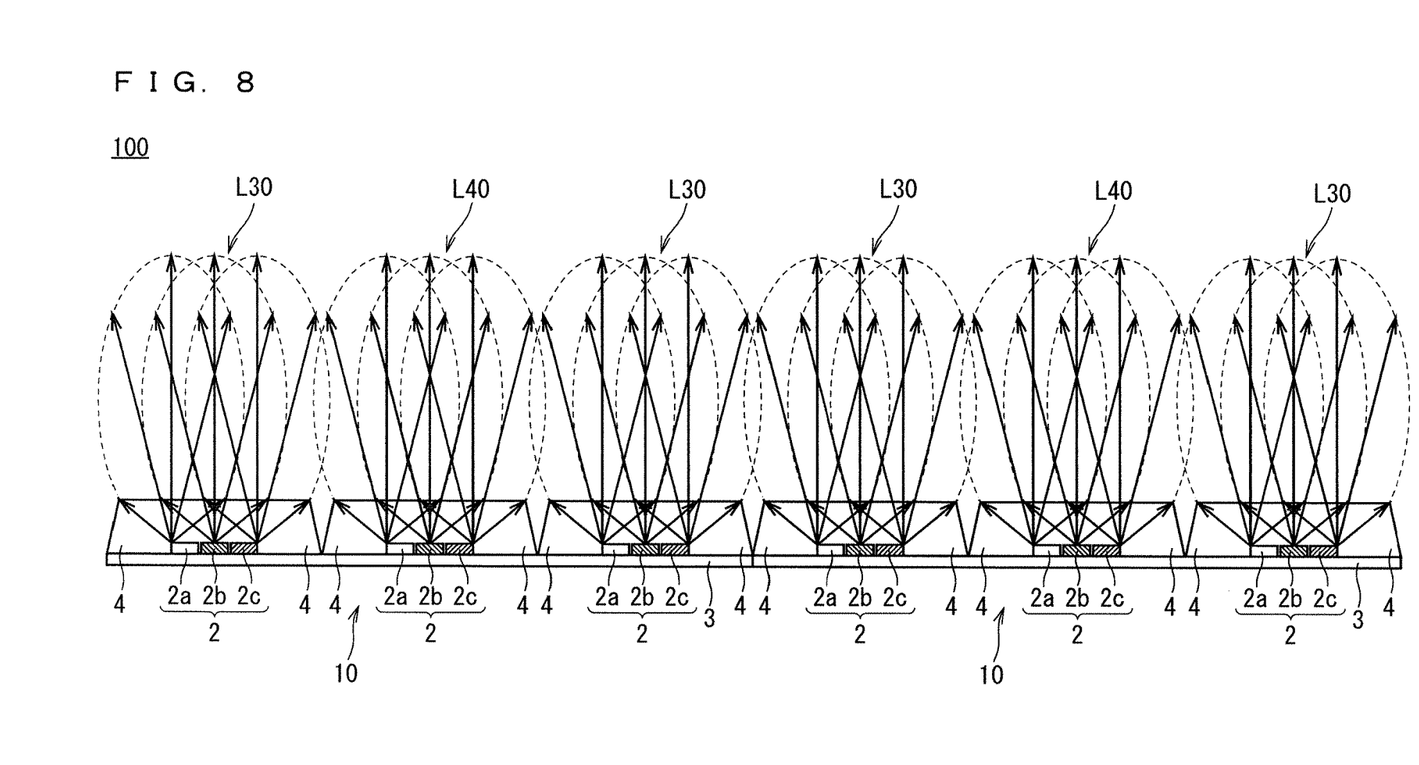
FIG. 8 is a diagram of a light-distribution property at a joint between the LED display panels according to the first embodiment.

FIG. 7 is a diagram of a light-distribution property of the COB LED display panel 10 according to the first embodiment. FIG. 8 is a diagram of a light-distribution property at a joint between the arranged COB LED display panels 10 of the LED display 100 according to the first embodiment.

In the first embodiment, the light-transmissive members 4 are individually provided to the pixel units 2. This provision enables light-distribution properties of outgoing light L30 emitted from the pixel units 2 located in the outermost peripheries of the substrates 3 (i.e., the left and right ends of FIG. 8) to be close to light-distribution properties of outgoing light L40 emitted from the pixel units 2 disposed inside the substrates 3. This prevents a step of luminance in the pixel units 2 located in the outermost peripheries of the substrates 3.

Consequently, when the COB LED display panels 10 are arranged to constitute a large screen as illustrated in FIG. 8, a visible step of luminance is prevented in the pixel units 2 at a boundary between the adjacent LED display panels 10 (i.e., the pixel units emitting the outgoing light L30). In other words, a joint between the LED display panels 10 is less likely to be visible. Thus, a more unified large screen is formed.

<Effect>

The LED display panel 10 according to the first embodiment includes the following: the plurality of chip-on-board LEDs 2a, 2b, and 2c arranged and mounted on the substrate 3, the LEDs 2a, 2b, and 2c each having the light-emitting surface on the surface opposite the substrate-3-side; and the plurality of light-transmissive members 4. Each light-transmissive member 4 is disposed on the substrate 3 to cover the light-emitting surface of at least one of the LEDs 2a, 2b, and 2c. Each light-transmissive member 4 is configured to enhance the directionality of the outgoing light emitted from the LEDs 2a, 2b, and 2c, and harmonize the orientation properties.

The LEDs 2a, 2b, and 2c, which emit light beams having different colors from each other, constitute a single pixel unit 2. The light-transmissive member 4 is over the light-emitting surfaces of the pixel unit 2. Such a configuration improves the light-distribution properties of the LEDs 2a, 2b, and 2c, enhances the efficiency of light use, and harmonizes the orientation properties of the LEDs 2a, 2b, and 2c.

Further, the LED display panel 10 according to the first embodiment is configured such that each light-transmissive member 4 has a shape of a frustum of a quadrangle, a lower base of which is the substrate-3-side.

The light-transmissive member 4 has a shape of a frustum of a quadrangle. This improves the light-distribution properties of the LED 2a, 2b, and 2c with a simple structure, enhances the efficiency of light use, and harmonizes the orientation properties of the LEDs 2a, 2b, and 2c. Moreover, the light-transmissive member 4 is made of a material having high thermal conductivity. This enhances an effect of heat dissipation of each of the LEDs 2a, 2b, and 2c.

Still further, the LED display 100 according to the first embodiment includes the plurality of LED display panels 10. The LED display panels 10 constitute a single large screen. When the LED display panels 10 are arranged to constitute a large screen, the joint between the LED display panels 10 is less likely to be visible. Thus, a more unified large screen is formed.

The method for manufacturing the LED display panel 10 according to the first embodiment includes the following steps: (a) preparing the substrate 3 on which the plurality of LEDs 2a, 2b, and 2c are mounted; and (b) preparing the light-transmissive-member mold 6 with which each light-transmissive member 4 is formed. The light-transmissive-member mold 6 includes the light-transmissive substrate 7 and the partitions 8 held by the light-transmissive substrate 7. The partitions 8 are each held by the light-transmissive substrate 7 in such a manner that the substrate-3-side of each light-transmissive member 4 is open. The method further includes the following steps: (c) filling the light-transmissive-member mold 6 with the ultraviolet-curing resin 12; (d) after the step (c), aligning the light-transmissive-member mold 6 and the substrate 3, on which the plurality of LEDs 2a, 2b, and 2c are mounted, and bringing the light-transmissive-member mold 6 into close contact with the substrate 3; (e) after the step (d), irradiating the ultraviolet-curing resin 12 with ultraviolet rays through the light-transmissive substrate 7 to cure the ultraviolet-curing resin 12 to form each light-transmissive member 4 on the substrate 3; and (f) after the step (e), separating the light-transmissive-member mold 6 form each light-transmissive member 4.

In the method for manufacturing the LED display panel 10 according to the first embodiment, the plurality of light-transmissive members 4 are directly formed on the plurality of LEDs 2a, 2b, and 2c with the light-transmissive-member mold 6 in a collective manner. As a result, the light-transmissive members 4, which harmonize the light-distribution properties of the LEDs 2a, 2b, and 2c, are formed on the substrate 3 at low cost and through less process steps.

The step (d) of the method for manufacturing the LED display panel 10 according to the first embodiment includes detecting the position of the LED 2b, which is mounted on the substrate 3, through the light-transmissive substrate 7 and the ultraviolet-curing resin 12, the detection being performed by the position detecting sensor 9.

By virtue of such a configuration, the method enables the light-transmissive members 4 to be disposed in positions corresponding to the individual LEDs with high accuracy even when the plurality of LEDs 2a, 2b, and 2c are arranged on the substrate 3 in high density.

In the first embodiment, the light-transmissive members 4 each have a shape of any lens that improves the light-distribution properties of the LEDs 2a, 2b, and 2c, enhances the effect of light use, and harmonize the orientation properties of the LEDs 2a, 2b, and 2c.

Second Embodiment

Figure 9:
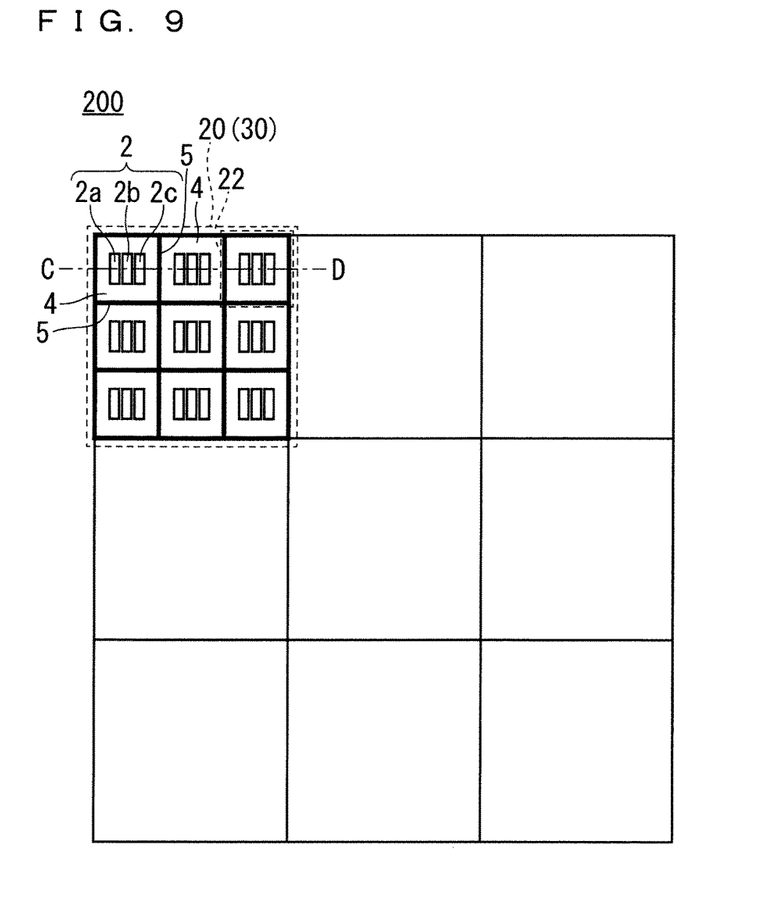
FIG. 9 is a plan view of an LED display panel according to a second embodiment.
Figure 10:
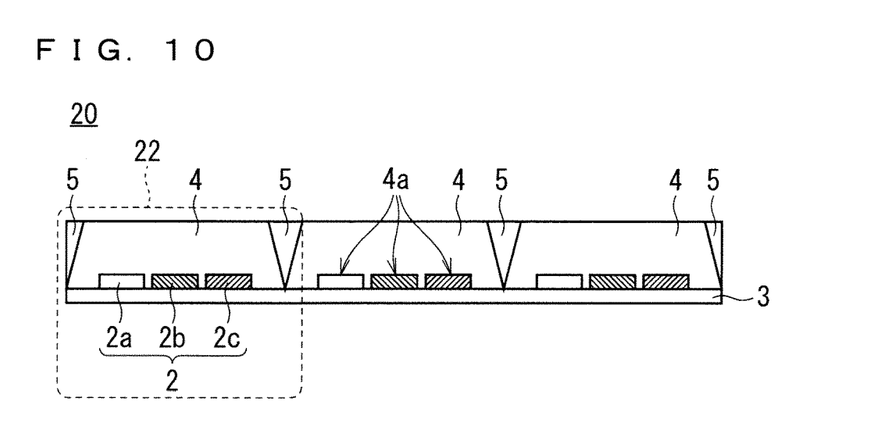
FIG. 10 is a cross-sectional view of an LED display panel according to the second embodiment.

FIG. 9 is a plan view of an LED display 200 according to a second embodiment. The LED display 200 includes a plurality of COB LED display panels 20 arranged in matrix. The LED display panels 20 each include the plurality of chip-on-board (COB) LED packages 22 arranged in matrix. FIG. 10 is a cross-sectional view of the COB LED display panel 20, taken along line CD in FIG. 9. The COB LED packages 22, which constitute the COB LED display panel 20, include the plurality of COB LEDs 2a, 2b, and 2c, the plurality of light-transmissive members 4, and light-blocking members 5.

As illustrated in FIG. 10, the light-blocking members 5 are each provided to fill a gap between the light-transmissive members 4 adjacent to each other. An example of the light-blocking member 5 is a black coating made of a carbon black ink.

Figure 11:
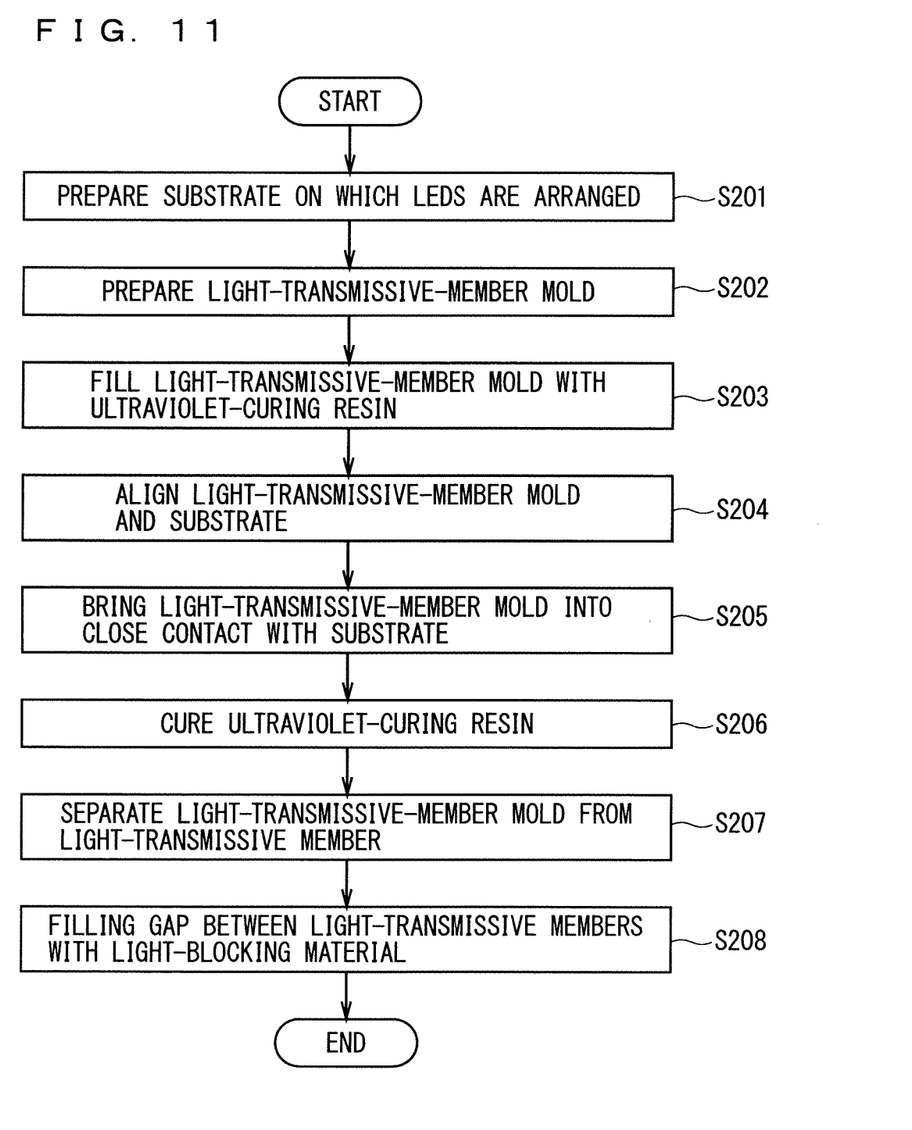
FIG. 11 is a flowchart of process steps for manufacturing the LED display panel according to the second embodiment.

FIG. 11 is a flowchart of process steps for manufacturing the COB LED display panel 20 according to the second embodiment. In FIG. 11, the first to sixth steps, i.e., the steps S201 to S206 are the same as those in the first embodiment (the steps S101 to 106 in FIG. 3). Accordingly, the description of the steps S201 to S206 will not be elaborated here. After the cure of the ultraviolet-curing resin 12, i.e., after the formation of the light-transmissive members 4, the seventh step (step S207) is separating the light-transmissive substrate 7 from the light-transmissive members 4 while bending the light-transmissive substrate 7. FIG. 6 illustrates this state. FIG. 6 is a cross-sectional view of the light-transmissive substrate 7 that has been separated from the light-transmissive members 4.

The eighth step (step S208) is filling gaps 5a between the adjacent light-transmissive members 4 with a light-blocking material to form the light-blocking members 5. Through these process steps, the COB LED display panel 20 according to the second embodiment is completed. Then, the LED display 200 is obtained by arranging the plurality of COB LED displays 20, each of which includes the plurality of COB LED packages 22 arranged in matrix, to form a single large screen.

<Effect>

The LED display panel 20 according to the second embodiment further includes the light-blocking member 5 filled between the adjacent light-transmissive members 4.

The LED display panel 20 is configured such that the light-blocking member 5 is provided to fill the gap between the adjacent light-transmissive members 4. Such a configuration enables unnecessary wide-angle components among light components emitted from each of the LEDs 2a, 2b, and 2c to be absorbed by the light-blocking member, and enables components among the light, the components being totally reflected on the inclined surfaces of the light-transmissive member having a shape of a frustum of a quadrangle to be emitted forward. This improves and harmonizes the light-distribution properties of the LEDs 2a, 2b, and 2c, enhances the efficiency of light use, and further reduces nonuniformity in luminance. Consequently, when the LED display panels 20 are arranged in matrix to constitute a large screen, a joint between the LED display panels 20 is unlikely to be visible. Thus, a more unified large screen is formed.

Further, the LED display 200 according to the second embodiment includes the plurality of LED display panels 20. The LED display panels 20 constitute a single large screen. When the LED display panels 20 are arranged to constitute the large screen, the joint between the LED display panels 20 is less likely to be visible. Thus, a more unified large screen is formed.

Still further, the method for manufacturing the LED display panel 20 according to the second embodiment further includes the following step: after the separation of the light-transmissive-member mold 6 from each light-transmissive members 4, filling, with the light-blocking member, the gap between the adjacent light-transmissive members 4 to form the light-blocking member 5 filled between the adjacent light-transmissive members 4.

The light-blocking member, which is, for instance, the black coating made of the carbon black ink, is filled between the adjacent light-transmissive members 4. This forms the light-blocking member 5.

Third Embodiment

Figure 12:
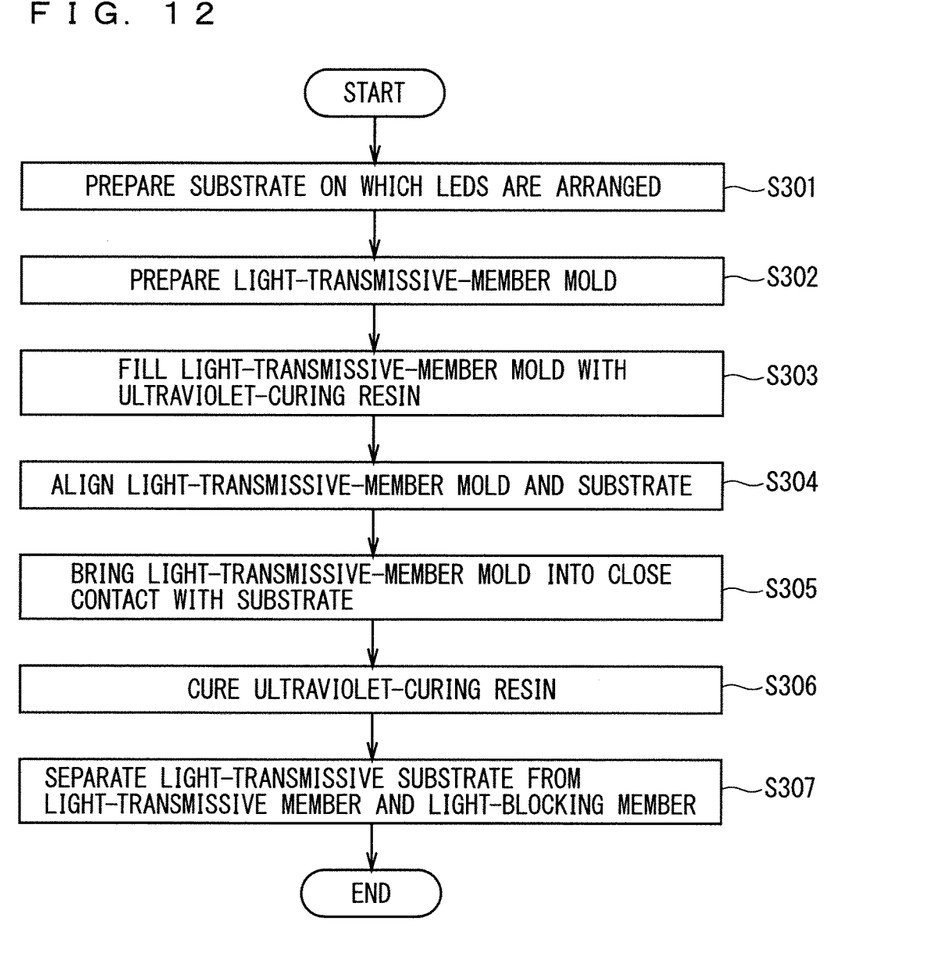
FIG. 12 is a flowchart of process steps for manufacturing an LED display panel according to a third embodiment.

A third embodiment describes another method for manufacturing the LED display 200. FIG. 12 is a flowchart of process steps for manufacturing a COB LED display panel 30 according to the third embodiment.

Figure 13:
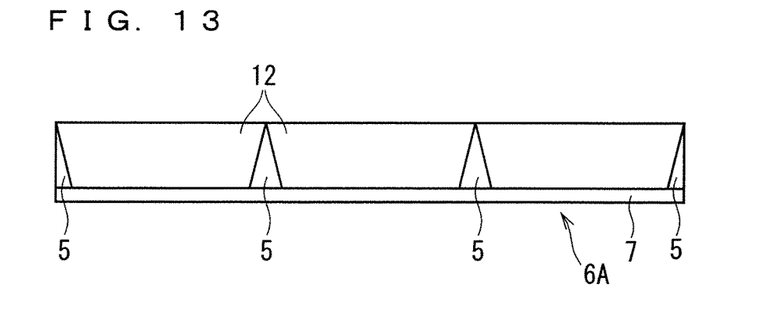
FIG. 13 is a cross-sectional view of a light-transmissive-member mold used in the manufacture of the LED display panel according to the third embodiment.

The first step (step S301) of preparing the substrate 3, on which LEDs are mounted, is the same as that in the second embodiment (the step S201 in FIG. 11). Thus, the description of the step S301 will not be elaborated here. The second step (step S302) is preparing a light-transmissive-member mold 6A. FIG. 13 is a cross-sectional view of the light-transmissive-member mold 6A. As illustrated in FIG. 13, the light-transmissive-member mold 6A includes the light transmissive substrate 7 and the light-blocking members 5. The light-blocking members 5 each have the same shape as the light-transmissive member 4. The light-blocking member 5 is held by the light transmissive substrate 7 in such a manner that the lower base of the light-transmissive member 4 is open.

The subsequent third to sixth steps (steps S303 to S306 in FIG. 12) are the same as those in the second embodiment (the steps S203 to S206). Thus, the description of the steps S303 to S306 will not be elaborated here.

Figure 14:
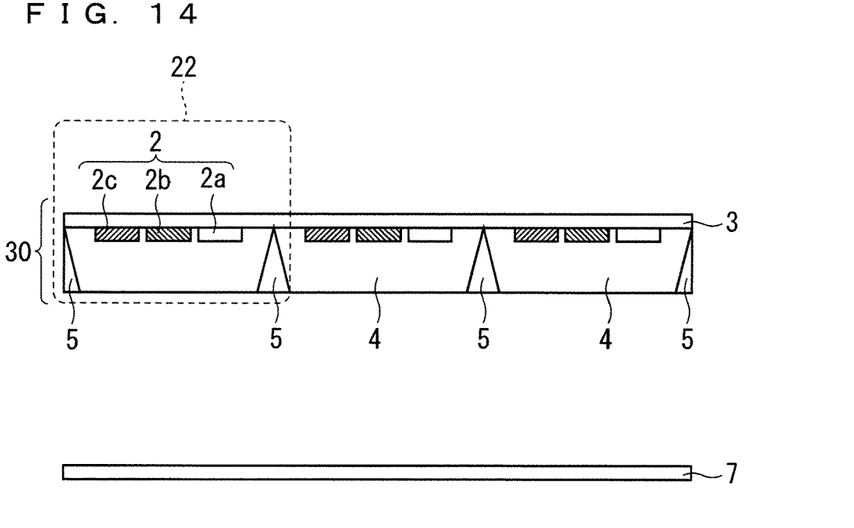
FIG. 14 is a diagram illustrating a step of forming a light-transmissive member in the manufacture of the LED display panel according to the third embodiment.

After the cure of the ultraviolet-curing resin 12, i.e., after the formation of the light-transmissive members 4, the seventh step (step S307) is separating the light-transmissive substrate 7 from the light-transmissive members 4 and the light-blocking members 5 while bending the light-transmissive substrate 7. FIG. 14 is a cross-sectional view of the light-transmissive substrate 7 that has been separated from the light-transmissive members 4 and the light-blocking members 5. Through these process steps, the COB LED display panel 30 according to the third embodiment is completed. Then, the LED display 200 is formed by arranging a plurality of the COB LED displays 30 to constitute a single large screen.

<Effect>

The method for manufacturing the LED display panel 30 according to the third embodiment includes the following steps: (h) preparing the substrate 3 on which a plurality of LEDs 2a, 2b, and 2c are arranged; and (i) preparing the light-transmissive-member mold 6A with which each light-transmissive member 4 is formed. The light-transmissive-member mold 6A includes the light-transmissive substrate 7 and the light-blocking members 5 disposed on the light-transmissive substrate 7. The light-blocking members 5 are each disposed on the light-transmissive substrate 7 in such a manner that the lower base of each light-transmissive member 4 is open. The method further includes the following steps: (j) filling the light-transmissive-member mold 6A with the ultraviolet-curing resin 12; (k) after the step (j), aligning the light-transmissive-member mold 6A and the substrate 3, on which the plurality of LEDs 2a, 2b, 2c are mounted, and bringing the light-transmissive-member mold 6A into close contact with the substrate 3; (l) after the step (k), irradiating the ultraviolet-curing resin 12 with ultraviolet rays through the light-transmissive substrate 7 to cure the ultraviolet-curing resin 12 to form each light-transmissive member 4 on the substrate 3; and (m) after the step (l), separating the light-transmissive substrate 7 from each light-transmissive member 4 and the light-blocking member 5.

In the method for manufacturing the LED display panel 30 according to the third embodiment, the light-blocking members 5 are disposed in the light-transmissive-member mold 6A in advance. Consequently, the formation of the light-transmissive members 4 on the substrate 3 is simultaneous with the formation of the light-blocking members 5. This eliminates the need for the step of forming the light-blocking members 5 after separating the light-transmissive-member mold 6A from the substrate 3, thereby achieving less process steps.

The step (k) of the method for manufacturing the LED display panel 30 according to the third embodiment includes detecting the positions of the LEDs 2a, 2b, and 2c, which are mounted on the substrate 3, through the light-transmissive substrate 7 and the ultraviolet-curing resin 12, the detection being performed by a position detecting sensor 9.

By virtue of such a configuration, the method enables the light-transmissive members 4 to be disposed in positions corresponding to the individual LEDs with high accuracy even when the plurality of LEDs 2a, 2b, and 2c are arranged on the substrate 3 in high density.

Fourth Embodiment

Figure 15:
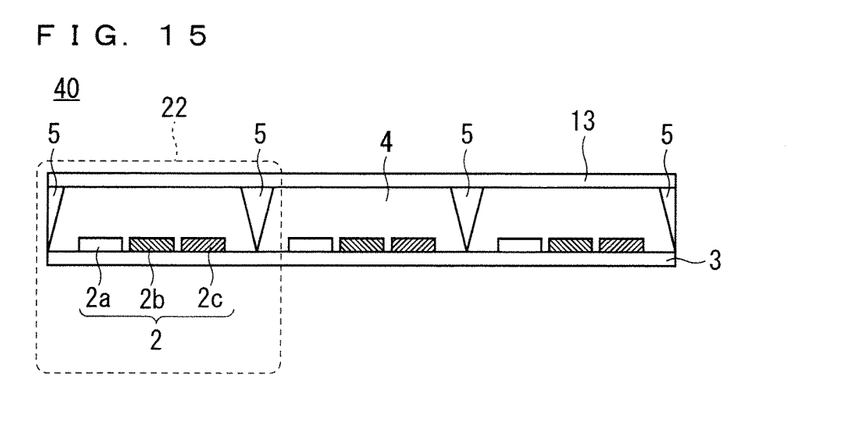
FIG. 15 is a cross-sectional view of an LED display panel according to a fourth embodiment.

FIG. 15 is a cross-sectional view of an LED display panel 40 according to a fourth embodiment. In the fourth embodiment, the LED display panel 40 includes a light-transmissive film 13 over the upper bases of the light-transmissive members 4 (i.e., a display surface of LED display panel 40). The light-transmissive film 13 has a surface processed to reduce reflections, the surface being opposite the light-transmissive member 4.

The light-transmissive film 13 is formed of a base layer and a reflection preventing layer. The reflection preventing layer faces the light-transmissive member 4 with respect to the base layer. The base layer is made of a material that transmits light (e.g., a polyester resin, acrylic resin, and glass). Further, the reflection preventing layer is made of a material having a refractive index smaller than a refractive index of the base layer (e.g., a metal fluoride including magnesium fluoride and aluminum fluoride). The light-transmissive film 13 preferably has good thermal conductivity.

All but the light-transmissive film 13 of the LED display panel 40 according to the fourth embodiment are the same as the components of the LED display panel 20 (FIG. 10). Thus, the description of the same components will not be elaborated here.

<Effect>

The LED display panel 40 according to the fourth embodiment further includes the light-transmissive film 13 over surfaces of the light-transmissive members 4, the surfaces being opposite the substrate 3 (in other words, the surface on the upper base side of the light-transmissive member 4). The light-transmissive film 13 is processed to reduce the reflections.

The light-transmissive film 13, which is processed to reduce the reflections and has high thermal conductivity, is disposed immediately on the light-transmissive members 4. This prevents unevenness caused by a difference between the height of each of the LEDs 2a, 2b, and 2c, and the height of the substrate 3 from being visible. Consequently, a uniform video image is displayed on an entire screen.

Fifth Embodiment

Figure 16:
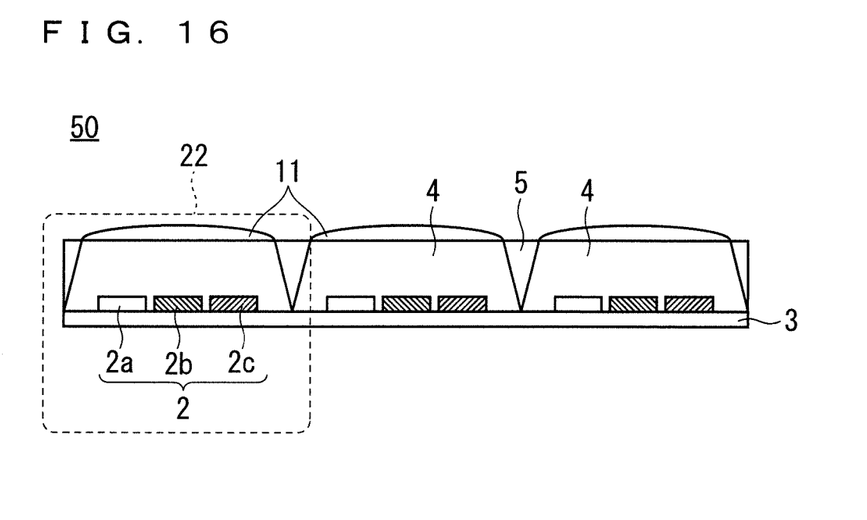
FIG. 16 is a cross-sectional view of an LED display panel according to a fifth embodiment.

FIG. 16 is a cross-sectional view of an LED display panel 50 according to a fifth embodiment. In the fifth embodiment, the LED display panel 50 includes a plurality of convex lenses 11 over the upper bases of the light-transmissive members 4 (i.e., a display surface of the LED display panel 50). Each convex lens 11 is provided to a corresponding set of the LEDs 2a, 2b, and 2c.

The convex lens 11 has a surface processed to reduce reflections, the surface being opposite the light-transmissive member 4. Such a reflection-reduction process is achieved by coating the surface of the convex lens 11 with, for instance, a metal fluoride. The convex lens 11 preferably has good thermal conductivity.

All but the convex lenses 11 of an LED display 300 according to the fifth embodiment are the same as the components of the LED display panel 20 (FIG. 10). Thus, the description of the same components will not be elaborated here.

<Effect>

The LED display panel 50 according to the fifth embodiment further includes the plurality of convex lenses 11 over the surfaces of the respective light-transmissive members 4, the surfaces being opposite the substrate 3 (in other words, the surface is on the upper base side of each light-transmissive member 4). The convex lenses 11 are each processed to reduce the reflections.

The convex lens 11, the surface of which is processed to reduce the reflections, is disposed immediately on the light-transmissive member 4. Such a configuration further harmonizes the light-distribution properties of the LEDs 2a, 2b, and 2c by virtue of the refraction of the convex lens 11. For instance, enhancing the directionality of the LEDs 2a, 2b, and 2c by the use of the convex lens 11 achieves a higher luminance.

The LED display panels 10, 20, 30, 40, and 50 according to the first to fifth embodiments are configured such that each light-transmissive member 4 is disposed on the substrate 3 to cover the light-emitting surfaces of the LEDs 2a, 2b, and 2c, which emit the light beams having different colors from each other.

In the first to fifth embodiments, a group of the LED 2a, which emits the red light beam, the LED 2b, which emits the green light beam, and the LED 2c, which emits the blue light beam, constitutes a single pixel unit 2. Moreover, the light-transmissive member 4 is disposed over the light-emitting surfaces for each pixel unit 2. This enables the orientation property to be adjusted per pixel unit.

Further, the LED display panels 10, 20, 30, 40, and 50 according to the first to fifth embodiments are configured such that the plurality of LEDs 2a, 2b, and 2c are arranged on the substrate 3 in matrix. The LEDs 2a, 2b, and 2c are arranged on the substrate 3 in matrix. Such a configuration achieves an LED-mounted substrate that is suitable for image display.

Still further, the LED display panels 10, 20, 30, 40, and 50 according to the first to fifth embodiments are configured such that each light-transmissive member 4 has a surface on the substrate-3-side, the surface having the recesses 4a. The LEDs 2a, 2b, and 2c are accommodated between each recess 4a and the substrate 3 without any gaps.

Such a configuration enables heat generated in the LEDs 2a, 2b, and 2c to be efficiently conducted to the light-transmissive members 4, thereby improves the efficiency of heat dissipation.

While the invention has been shown and described in detail, the foregoing description is in all aspects illustrative and not restrictive. It is therefore understood that numerous modifications and variations can be devised without departing from the scope of the invention.

EXPLANATION OF REFERENCE SIGNS 2, 21 pixel unit, 2a, 2b, 2c LED, 22 LED package, 3 substrate, 4, 41 light-transmissive member, 4a recess, 5 light-blocking member, 5a gap, 6, 6A light-transmissive-member mold, 7 light-transmissive substrate, 8 partition, 9 position detecting sensor, 10, 20, 30, 40, 50 LED display panel, 11 convex lens, 12 ultraviolet-curing resin, 13 light-transmissive film, and 100, 200 LED display.

The invention claimed is:

1. A method for manufacturing an LED display panel, the LED display panel comprising
   a plurality of chip-on-board LEDs arranged and mounted on a substrate, the LEDs each comprising a light-emitting surface on a surface opposite a substrate side, and
   a plurality of light-transmissive members,
   each light-transmissive member being disposed on the substrate to cover the light-emitting surface of at least one of the LEDs,
   each light-transmissive member being configured to enhance a directionality of outgoing light emitted from the LEDs,
   the method comprising the steps of:
   (a) preparing the substrate, on which the plurality of LEDs are mounted; and
   (b) preparing a light-transmissive-member mold with which each light-transmissive member is formed,
   the light-transmissive-member mold comprising
   a light-transmissive substrate, and
   a partition held by the light-transmissive substrate,
   the partition being held by the light-transmissive substrate in such a manner that the substrate side of each light-transmissive member is open,
   the method further comprising the steps of:
   (c) filling the light-transmissive-member mold with an ultraviolet-curing resin;
   (d) after the step (c), detecting positions of the LEDs, which are mounted on the substrate, through the light-transmissive substrate and the ultraviolet-curing resin, the detection being performed by a position detecting sensor, so as to align the light-transmissive-member mold and the substrate, on which the plurality of LEDs are mounted, and to bring the light-transmissive-member mold into close contact with the substrate;
   (e) after the step (d), irradiating the ultraviolet-curing resin with ultraviolet rays through the light-transmissive substrate to cure the ultraviolet-curing resin to form each light-transmissive member on the substrate; and
   (f) after the step (e), separating the light-transmissive-member mold from each light-transmissive member.

2. The method according to claim 1, further comprising the step of (g) after the step (f), filling, with a light-blocking material, a gap between the light-transmissive members adjacent to each other to form a light-blocking member filled between the adjacent light-transmissive members.

3. A method for manufacturing an LED display panel, the LED display panel comprising
   a plurality of chip-on-board LEDs arranged and mounted on a substrate, the LEDs each comprising a light-emitting surface on a surface opposite a substrate side,
   a plurality of light-transmissive members, and
   a light-blocking member filled between the light-transmissive members adjacent to each other,
   each light-transmissive member being disposed on the substrate to cover the light-emitting surface of at least one of the LEDs, each light-transmissive member being configured to enhance a directionality of outgoing light emitted from the LEDs, the method comprising the steps of:

(h) preparing the substrate, on which the plurality of LEDs are mounted; and (i) preparing a light-transmissive-member mold with which each light-transmissive member is formed, the light-transmissive-member mold comprising
a light-transmissive substrate, and
the light-blocking member disposed on the light-transmissive substrate,
the light-blocking member being disposed on the light-transmissive substrate in such a manner that a surface of each light-transmissive member is open, the surface being on the substrate side, the method further comprising the steps of:

(j) filling the light-transmissive-member mold with an ultraviolet-curing resin;

(k) after the step (j), aligning the light-transmissive-member mold and the substrate, on which the plurality of LEDs are mounted, and bringing the light-transmissive-member mold into close contact with the substrate;

(l) after the step (k), irradiating the ultraviolet-curing resin with ultraviolet rays through the light-transmissive substrate to cure the ultraviolet-curing resin to form each light-transmissive member on the substrate; and (m) after the step (l), separating the light-transmissive substrate from each light-transmissive member and the light-blocking member.

4. The method according to claim 3, wherein the step (k) comprises detecting positions of the LEDs, which are mounted on the substrate, through the light-transmissive substrate and the ultraviolet-curing resin, the detection being performed by a position detecting sensor.

* * * * *